(12) United States Patent
Turner

(10) Patent No.: US 6,518,782 B1
(45) Date of Patent: Feb. 11, 2003

(54) ACTIVE POWER MONITORING USING EXTERNALLY LOCATED CURRENT SENSORS

(75) Inventor: Jonathan E. Turner, Lewis Center, OH (US)

(73) Assignee: Delta Design, Inc., Poway, CA (US)

(*) Notice: Subject to any disclaimer, the term of this patent is extended or adjusted under 35 U.S.C. 154(b) by 105 days.

(21) Appl. No.: 09/649,990

(22) Filed: Aug. 29, 2000

(51) Int. Cl.[7] .......................... G01R 31/02; G01R 1/04
(52) U.S. Cl. .................... 324/760; 324/754; 324/158.1
(58) Field of Search ........................... 324/760, 761, 324/754, 755, 763, 158.1; 219/209; 702/130, 132; 713/300, 320, 322, 380; 165/803, 804

(56) References Cited

U.S. PATENT DOCUMENTS

| | | |
|---|---|---|
| 3,710,251 A | 1/1973 | Hagge et al. |
| 3,922,527 A | 11/1975 | Witkin et al. ............... 219/494 |
| 3,971,876 A | 7/1976 | Witkin et al. ................ 13/31 |
| 4,066,868 A | 1/1978 | Witkin et al. ............... 219/486 |
| 4,324,285 A | 4/1982 | Henderson ..................... 165/2 |
| 4,330,809 A | 5/1982 | Stanley |
| 4,385,273 A | 5/1983 | Lienhard et al. |
| 4,604,572 A | 8/1986 | Horiuchi et al. ............ 324/760 |
| 4,637,020 A | 1/1987 | Schinabeck |
| 4,686,627 A | 8/1987 | Donovan et al. |
| 4,713,612 A | 12/1987 | Takamine |
| 4,734,872 A | 3/1988 | Eager et al. ................ 364/557 |
| 4,744,408 A | 5/1988 | Pearson et al. ................ 165/2 |
| 4,777,434 A | 10/1988 | Miller et al. ................ 324/757 |
| 4,784,213 A | 11/1988 | Eager et al. .................... 165/2 |
| 4,857,837 A | * 8/1989 | Baran et al. ............ 324/117 R |
| 4,881,591 A | 11/1989 | Rignall |
| 4,926,118 A | 5/1990 | O'Connor et al. .......... 324/760 |
| 5,006,796 A | 4/1991 | Burton et al. ............... 324/760 |
| 5,084,671 A | 1/1992 | Miyata et al. |
| 5,099,908 A | 3/1992 | Taraci et al. ................... 165/1 |
| 5,126,656 A | 6/1992 | Jones ......................... 324/760 |
| 5,143,450 A | 9/1992 | Smith et al. .................. 374/12 |

(List continued on next page.)

FOREIGN PATENT DOCUMENTS

| | | |
|---|---|---|
| DE | 35 36098 | 4/1987 |
| EP | 0 837 335 A1 | 1/1998 |
| JP | 02268275 A | 11/1990 |
| JP | 3054141 B | 8/1991 |
| JP | 08-072841 | 3/1996 |
| JP | 09-264647 | 10/1997 |
| JP | 01237461 A | 9/1998 |
| WO | 94/22029 | 9/1994 |
| WO | 98/05060 | 2/1998 |

OTHER PUBLICATIONS

Tustaniwskyj, Jerry I., et al. *Constant Temperature Control of a Device Under Test (DUT)—Part 1*, Development Services Organization, Unisys Corporation, San Diego, CA pp. 1–6.

Primary Examiner—Kamand Cuneo
Assistant Examiner—Jermele Hollington
(74) Attorney, Agent, or Firm—Foley & Lardner (57) ABSTRACT

The power of a device under test (DUT) is monitored without reliance on dedicated current and voltage monitoring signals available from a semiconductor test unit. One or more magneto-resistive current sensors are provided external to, and in between the DUT and a power source. The current sensor(s) provide a detection signal proportional to the current drawn by the device from the power source. A monitoring circuit multiplies the detected current by the core voltage supply to the DUT to obtain a signal representative of the power of the device. The power signal is provided to a control circuit that operates a heat exchanger, such as on active conductive heat exchanger, to adjust the temperature of the device based on the signal representative of the power of the device. In this way the temperature of the DUT can be maintained at or near a constant set point.

30 Claims, 10 Drawing Sheets

U.S. PATENT DOCUMENTS

| | | | |
|---|---|---|---|
| 5,164,661 A | 11/1992 | Jones | 324/760 |
| 5,172,049 A | 12/1992 | Kiyokawa et al. | 324/760 |
| 5,177,435 A | 1/1993 | Kiyokawa et al. | 324/755 |
| 5,205,132 A | 4/1993 | Fu | 62/208 |
| 5,233,161 A | 8/1993 | Farwell et al. | 219/209 |
| 5,263,775 A | 11/1993 | Smith et al. | 374/134 |
| 5,287,292 A | 2/1994 | Kenny et al. | |
| 5,297,621 A | 3/1994 | Taraci et al. | 165/104.13 |
| 5,309,090 A | 5/1994 | Lipp | 324/158.1 |
| 5,315,240 A | 5/1994 | Jones | 324/760 |
| 5,324,916 A | 6/1994 | Goto et al. | |
| 5,332,884 A | 7/1994 | Bailey | 219/494 |
| 5,359,285 A | 10/1994 | Hashinaga et al. | 324/158.1 |
| 5,369,245 A | 11/1994 | Pickering | 219/209 |
| 5,381,087 A | 1/1995 | Hirano | 324/158.1 |
| 5,420,521 A | 5/1995 | Jones | 324/760 |
| 5,457,400 A | 10/1995 | Ahmad et al. | 324/763 |
| 5,552,744 A | 9/1996 | Burlison et al. | 327/401 |
| 5,569,950 A | 10/1996 | Lewis et al. | |
| 5,582,235 A | 12/1996 | Hamilton | |
| 5,614,837 A | 3/1997 | Itoyama et al. | 324/760 |
| 5,648,728 A | 7/1997 | Canella | 324/755 |
| 5,802,856 A * | 9/1998 | Schaper et al. | 165/206 |
| 5,821,505 A | 10/1998 | Tustaniwakyj et al. | 219/494 |
| 5,844,208 A | 12/1998 | Tustaniwskyj et al. | 219/494 |
| 5,847,293 A | 12/1998 | Jones | 73/865.8 |
| 5,864,176 A | 1/1999 | Babock et al. | 257/714 |
| 5,894,217 A | 4/1999 | Igarashi et al. | 324/158.1 |
| 6,232,739 B1 * | 5/2001 | Krefta et al. | 324/207.25 |
| 6,246,593 B1 * | 6/2001 | Cheng | 363/17 |

\* cited by examiner

ACTIVE POWER MONITORING USING EXTERNALLY LOCATED CURRENT SENSORS

CROSS-REFERENCE TO RELATED APPLICATIONS

This application relates to commonly assigned U.S. patent application Ser. No. 09/352,760 of Tom Jones et al., filed Jul. 14, 1999, the disclosure of which is hereby incorporated by reference as if fully set forth herein.

FIELD OF THE INVENTION

This invention relates to an apparatus and method for monitoring the power of a device under test (DUT). More particularly, the invention relates to an apparatus and method in which the power of a semiconductor device under test is monitored without reliance on dedicated current and voltage monitoring signals available from a semiconductor test unit.

BACKGROUND OF THE INVENTION

The above identified, commonly owned U.S. application Ser. No. 352,760 relates to a technique for monitoring the current and voltage of a device in order to determine the power consumption of that device. The calculated power consumption is then used to thermally condition the device, for example, to maintain the temperature of the device at or near a constant set point. While having more general applicability, such technique may advantageously be utilized in connection with performance testing of semiconductor devices, such as memory devices or microprocessors.

Performance testing is typically accomplished by connecting the semiconductor device to a load board of a test device, which then performs various testing on the semiconductor device. For example, the test device may measure the maximum operating frequency of the semiconductor device. It is known, however, that devices under test (DUTs) self-heat, and that the resulting rise in temperature may cause the performance of the DUT to degrade. This may cause under-reporting of the performance of the DUT. Various temperature forcing techniques may be used to attempt to maintain the temperature of the DUT around a constant set-point. However, with many current semiconductor devices, instantaneous power fluctuations may be so severe and dramatic, that current temperature forcing systems often fail to accurately offset effects of self-heating.

The power monitoring technique of application Ser. No. 352,760 involves measuring instantaneous power fluctuations in order to predict changes in self-heating before they occur. Measured power fluctuation is utilized to control a temperature forcing system in order to offset self-heating to maintain a DUT at a constant set point. This technique may use signals from the test units power supply to determine the power being supplied to the DUT. There are currently, however, various types of test units are now available which vary in design. Many test units do not provide output terminals to provide power supply monitoring signals, and in many cases, the power supply is not readily accessible. Further, it is necessary to avoid interruption of the power supply in any way that would interfere with or degrade the characteristics of the power signals to the DUT. Thus, there is a need for a technique to measure the voltage and current utilized by a DUT in a way that avoids adverse effects on the power supplied to the DUT.

SUMMARY OF THE INVENTION

In accordance with an embodiment of the present invention, a device provides active monitoring of power of an electronic device, such as a semiconductor device under test. The device according to the invention, includes at least one magneto-resistive current sensor provided external to the device and a power source. The current sensor detects current to the device and provides a detection signal proportional to the current drawn by the device from the power source. A monitoring circuit receives as input the detection signal from the magneto-resistive current sensor and a signal representative of voltage supplied to the device from the power source, and multiplies those signals to obtain a signal representative of the power of the device.

In accordance with another embodiment of the invention, a method of detecting the power of an electrical device, such as a semiconductor device under test, includes detecting current drawn by the device from a power source with at least one magneto-resistive current sensor provided external to the device and the power source. The current sensor detects current to the device and provides a detection signal proportional to the current drawn by the device from the power source. Instantaneous power of the device is calculated based on the detection signal from the magneto-resistive current sensor and a signal representative of voltage supplied to the device from the power source.

In accordance with another embodiment of the invention, a system controls the temperature of an electronic device. The system includes an active power measuring circuit comprised of at least one magneto-resistive current sensor provided external to, and in between the electronic device and a power source. The current sensor provides a detection signal that is proportional to the current drawn by the electronic device from the power source. The detection signal is multiplied by a signal representative of voltage supplied to the electronic device from the power source to obtain a signal representative of the power of the electronic device. A heat exchanger regulates the temperature of the electronic device in response to a control circuit that adjusts the heat exchanger based on the detected power consumption of the device.

According to one aspect of the invention, the power source and the current sensor(s) are located on a common board (e.g., the load board) of a semiconductor test unit. Alternatively, the current sensor(s) is (are) located on a separate board separate board, between the power supply to the device and the device itself. The monitoring circuit is provided on a printed circuit board which is connected to the load board by an interface cable, which transmits signals from the at least one current sensor.

According to another aspect of the invention, a plurality of current sensors are arranged in parallel to thereby divide the current supplied from the power supply to the electronic device, wherein each current sensor outputs a corresponding detection signal proportional to detected current. The monitoring circuit sums each output from the plurality of current sensors to obtain a signal corresponding to the total current drawn by the electronic device.

According to another aspect of the invention, the monitoring circuit includes an isolation amplifier that provides an isolated signal based on the signal representative of the voltage supplied to the electronic device from the power source. The isolated signal is multiplied by a signal corresponding to total current drawn by the electronic device as detected by the at least one current sensor.

According to another aspect of the invention, the signal representative of the power of the electronic device is provided to a thermal control circuit that controls the temperature of the electronic device. The thermal control circuit controls a heat exchanger that selectively heats or cools the electronic device in response to detected power drawn by the electronic device to maintain the device near a constant set point.

According to another aspect of the invention, the heat exchanger is comprised of an active, conductive heater.

DETAILED DESCRIPTION

The above-noted and other aspects of the present invention will become more apparent from a description embodiment of the invention, when read in conjunction with the accompanying drawings.

Power Following System

Figure 1:
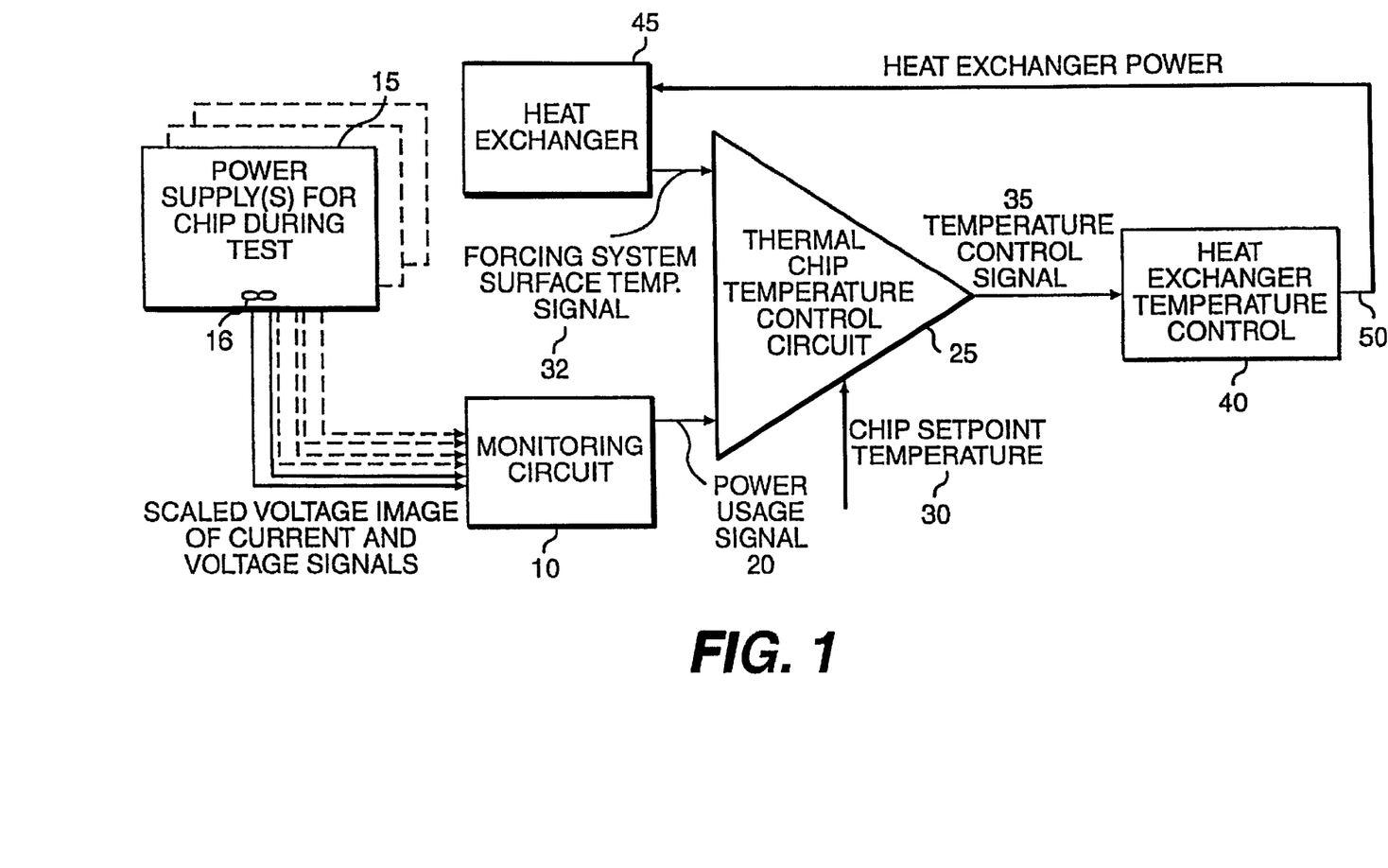
FIG. 1 is a block diagram of a system in which the power supplied to a device under test is monitored to provide feedback to a temperature forcing system that maintains the temperature of the DUT.

FIG. 1 illustrates a system as described in U.S. application Ser. No. 352,760 in which the power supplied to a DUT device under test or in operation (referred to herein as a "DUT") is monitored to provide feedback to a temperature forcing system. Based on that feedback, the temperature forcing system maintains the temperature of the DUT. In this example, the DUT may comprise a semiconductor device or "chip." One or more power supply(s) provide core voltage power signal(s) to the DUT.

A monitoring circuit 10 monitors DUT power. If there are more than one power supplies 15, then the monitor circuit 10 sums the total power usage. In this example, an electrical connection point 16 links the monitor circuit 10 to each power supply 15. The electrical connection point 16 provides the monitor circuit 10 with indication of the power usage of the electronic device, such as a voltage image of the current through the electronic device and a voltage level at which the electronic device is being operated or tested. Thus, this example illustrates a system in which electrical connection points 16 are available from the power supplies of the test unit that tests the DUT. As discussed above, however, such connection points 16 are not always available. The invention described herein addresses such problem.

As further shown in FIG. 1, the monitor circuit 10 sends a power usage signal 20 (a voltage representing the value of the power usage) to a thermal control circuit 25. Based on a given chip set point temperature or a signal representing the set point temperature 30, as well as on a forcing system surface temperature or a signal representing the forcing system surface temperature 32, the thermal control circuit 25 translates the power usage signal 20 into a temperature control signal 35. The thermal control circuit 25 provides the temperature control signal 35 to a heat exchanger temperature control 40. The heat exchanger temperature control 40 contains a heat exchanger power supply (not shown) with a power amplifier and controls temperature of the electronic device under test (or operation) by adjusting the output current of power supplied to a heat exchanger to 45 through connection 50. The resulting temperature of the heat exchanger is the forcing system surface temperature 32.

In this example, the thermal control circuit 25 provides a signal that regulates the current provided to a variable resistance device ("RTD") in the heat exchanger 45. The RTD responds to the forcing system surface temperature and outputs a voltage representing the forcing system surface temperature 32. The forcing system surface temperature voltage 33 feeds back into the thermal control circuit 25.

Figure 2:
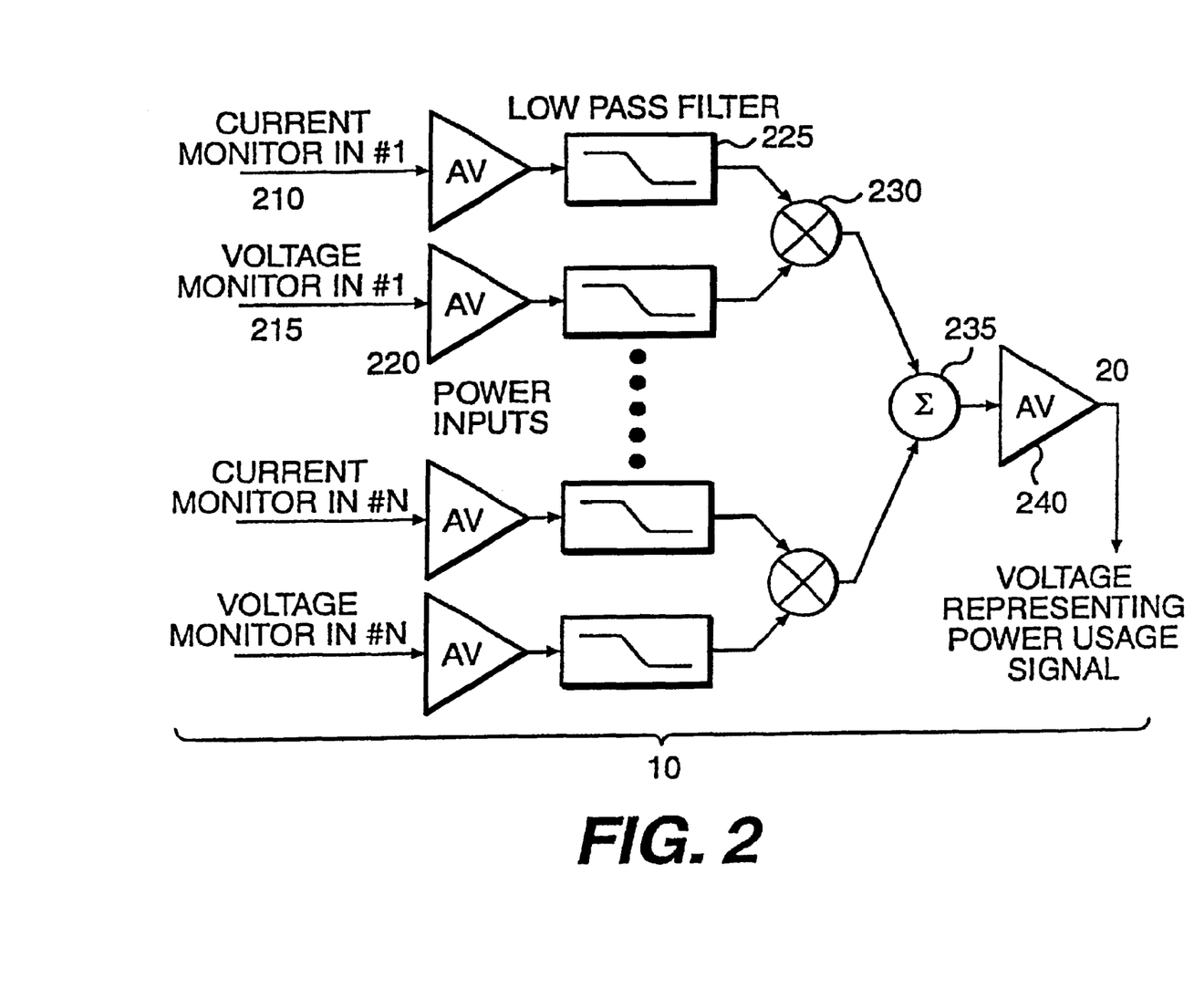
FIG. 2 is a block diagram illustrating a current summing portion of the monitoring circuit FIG. 1

FIG. 2 is a block diagram illustrating a calculating function of the monitoring circuit 10 where more than one devices supply power to the electronic device. As illustrated in FIG. 1, each electrical connection 16 provides current signals 210 and voltage signals 215 from its corresponding power supply 15 to the monitor circuit 10. Each current and voltage signal 210, 215 passes through a respective first amplifier 220, where it is amplified and into a low pass filter 225, which removes wide-band noise and high frequency components of the signal. The current signals 210 and voltage signals 210 may be in the form of voltages representing the values of the respective current or voltage.

The thermal components of the system respond more slowly (e.g. in the millisecond range) than does the power supplied to the electronic device under test (e.g. in the nanosecond range). Accordingly, the high frequency components of the current and voltage signals 210, 215 add no value. Removing the high frequency components of the current and voltage signals 210, 215 matches the bandwidth of the current and voltage signals 210, 215 to the bandwidth of the rest of the control circuit and simplifies the task of stabilizing the temperature control. The current and voltage signals 210, 215 for a particular power supply then pass together into a first multiplying circuit 230, which uses the current and voltage signals 210, 215 to calculate power usage for that particular power supply.

For every power supply, the monitoring circuit 10 uses the following equation to calculate the power usage from the current and voltage signals 210, 215:

$$P = I * V \tag{Eqn. 1}$$

Where:
P=power usage in watts
I=current signal in amps
V=voltage signal in volts.

If the power supply 15 provides a voltage image of the current being drawn by the electronic device, then a scaling factor is required which describes the volts-to-amps relationship of the voltage image signal. If the electronic device is being tested, the scaling factor is derived from characteristics of the power supply to the tester (also powering the electronic device under operation or test) being used to test the electronic device. For example, the scaling factor of Schlumberger's VHCDPS tester is 1.0, while the scaling factor of Schlumberger's HCDPS tester is 0.87. The scaling factor is made available to the monitoring circuit to allow the conversion of the signal in volts to a corresponding current value in amps. The scaling factor can also be determined empirically by measuring the actual current and the signal voltage simultaneously, and then dividing the voltage by the measured amperage. It may also be determined by the setting one or more specific current outputs and dividing by the measured the signal voltage(s).

The output from all the first multiplying circuits 230 pass into a single summing circuit 235, which sums the power usage from all of the power supplies into the power usage signal 20. The power usage signal 20 may be in the form of a voltage representing that value and passes through a second amplifier 240 before leaving the monitoring circuit and going on to the thermal control circuit as the power usage signal 20.

Figure 3:
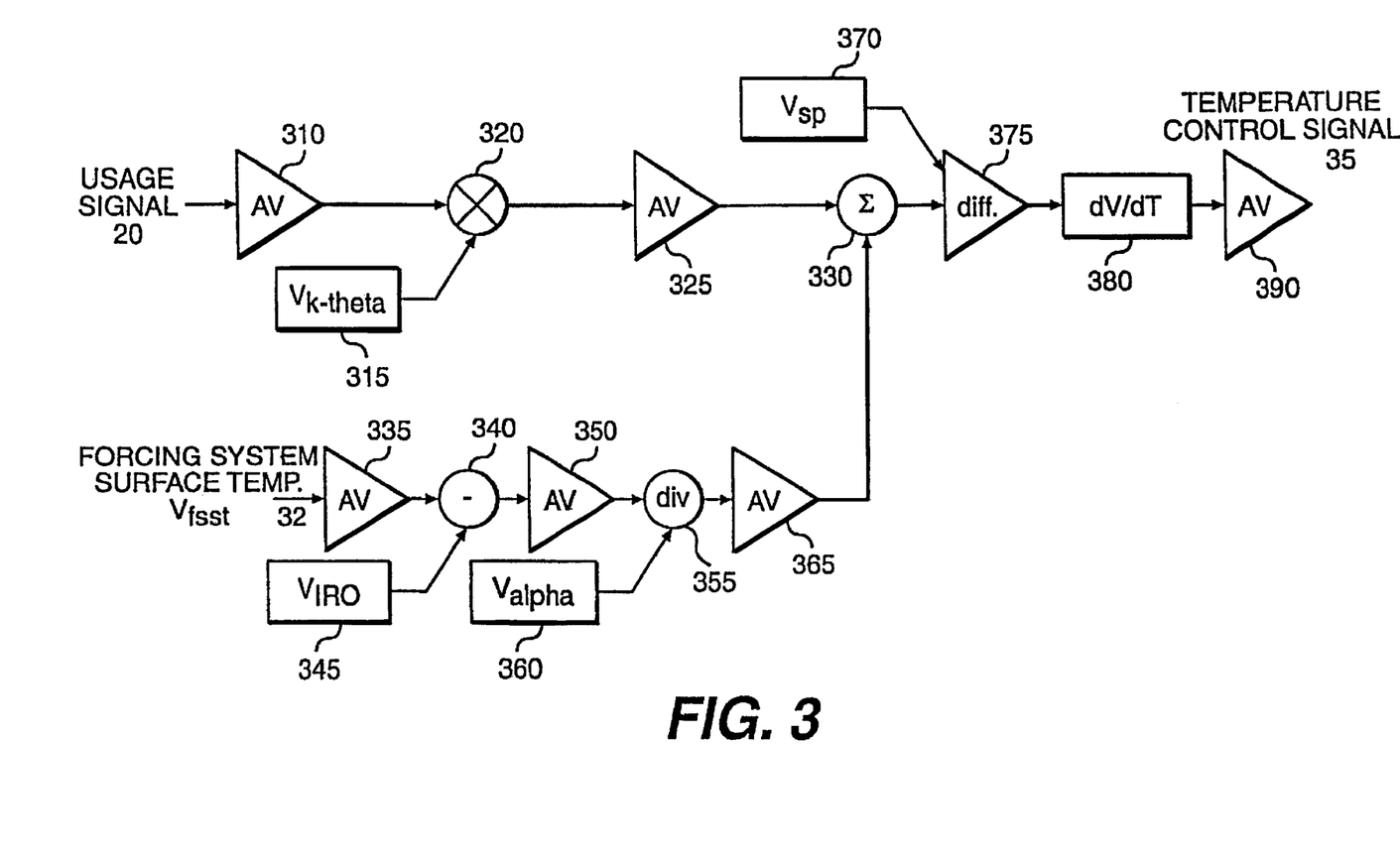
FIG. 3 is a block diagram illustrating in more detail a power computation portion of the monitoring circuit FIG. 1.

FIG. 3 is a block diagram illustrating in more detail a power computation portion of the monitoring circuit 10 of FIG. 1. The temperature of the electronic device being tested or under operation can be determined using the following equation:

$$\text{Chip temperature} = K_{theta} * P_{ed} + T_{fss} \quad \text{(Eqn. 2)}$$

Where:

Chip temperature (° C.) represents the chip temperature derived from its power dissipation.

$K_{theta}$ is a constant (° C./watts) derived from the capabilities of the temperature forcing system and the thermal resistance of the medium (or media, in those cases where heat spreaders, lids, or other devices are attached to the top of the device itself) between the electronic device and the heat exchanger.

$P_{ed}$ (watts) is the total power usage, reflected in the power usage signal 20 obtained from the monitoring circuit 10.

$T_{fss}$ (° C.) is the system surface forcing temperature and is the absolute temperature of the medium contacting the chip, as measured by a temperature sensor embedded in the thermal control system surface.

$K_{theta}$ is also derived from the general efficiency of the thermal control system when in contact with the DUT. For example, at setpoint temperatures well above ambient, the DUT loses proportionally more heat to its surroundings, and the thermal control system must work harder to raise DUT temperature than to lower it. From the standpoint of a thermal control system responding to DUT self-heating, the overall effect is the same as a lower thermal resistance between the DUT and the heat exchanger operating at an ambient setpoint. Similarly, at setpoint temperatures well below ambient, the DUT gains heat from its surroundings, and the thermal control system must work harder to lower temperature than to raise it. From the standpoint of a thermal control system responding to DUT self-heating, the overall effect is the same as a higher thermal resistance between the DUT and the heat exchanger operating at an ambient setpoint. In both cases, $K_{theta}$ is adjusted to reflect the effect of heat transfer to the DUT's surrounding environment during power excursions.

$K_{theta}$ may be considered an effective or a fine-tuned thermal resistance of the medium. Although the thermal resistance of different media are set out in standard chemistry reference books (such as *CRC Handbook of Chemistry and Physics*, 77$^{th}$ Edition; David R. Lide, Editor-in-Chief), factors such as ambient humidity, pressure, and temperature may affect the actual thermal resistance. Thermal resistance may also be affected by the physical configuration of the test. To determine $K_{theta}$, one can use a calibration process to adjust the value of the anticipated thermal resistance of the medium and ascertain whether the result is an improvement. Another advantage of a calibration process is that it will automatically account for the "efficiency factor" of the heat transfer from the DUT to the thermal control system as a function of the setpoint temperature.

As described above, $K_{theta}$ offers the advantage of incorporating the effects of a variety of variables into one term. In the preferred embodiment, $K_{theta}$ only needs to be optimized for a given application, or type of DUT, and then can be used to test many different devices of the same type. Additionally, one practical effect of $K_{theta}$ is that in mirroring the monitored power consumption of the device with the temperature of the temperature forcing system, $K_{theta}$ magnifies or compresses the relative magnitude of the mirroring.

In the thermal summing circuit 330, the temperature control signal 35 is determined using the following equation:

$$V_{tcs} = d(V_{sp} - ((V_{k\text{-}theta} * V_{Ped}) + (V_{fsst} - V_{IRO})/V_{alpha}))/dt \quad \text{(Eqn. 3)}$$

Where:

$V_{tcs}$ is the temperature control signal.

$V_{sp}$ is a set point temperature voltage 375, a voltage representing the set point temperature for the electronic device.

$V_{k\text{-}theta}$ is a voltage 315 representing the $K_{theta}$ value. The $K_{theta}$ value is inputted into a digital to analog converter, which generates a voltage corresponding to the value of the input.

$V_{Ped}$ is the total power usage signal 20 obtained from the monitoring circuit 10 (see FIG. 1A) and which represents the watts consumed by the DUT.

$V_{fsst}$ is the forcing system surface temperature voltage 32 generated by digital to analog conversion and representing the forcing system surface temperature.

$V_{IRO}$ 345 is a voltage generated by digital to analog conversion which represents a voltage equal to the value of the precise constant current from the first precise constant current source 28 in the thermal control board 27 multiplied by the resistance shown by the variable resistance device in the heat exchanger at 0 degrees C. This can be determined when the embedded temperature sensor in the heat exchanger is calibrated.

$V_{alpha}$ 360 is a voltage generated by digital to analog conversion and represented the slope of a curve for the variable resistance device in the heat exchanger of resistance versus temperature. This can be determined when the embedded temperature sensor in the heat exchanger is calibrated.

Referring to FIG. 3, the power usage signal 20 from the monitoring circuit 10 (see FIG. 1) enters the thermal control circuit 25 by passing through a third amplifier 310. The power usage signal is provided to a second multiplying circuit 320, where it is multiplied with a $V_{k\text{-}theta}$ 315 to create a first modified signal. The modified power usage signal is provided to a fourth amplifier 325 and from there into a thermal summing circuit 330. The voltage representing forcing system surface temperature $V_{fsst}$ 32 also enters the thermal control circuit 25 by passing through a fifth amplifier 335. From there, $V_{fsst}$ 32 passes into a subtracting circuit 340 where $V_{IRO}$ 345 is subtracted from $V_{fsst}$ 32 for a calibrated $V_{fsst}$. The calibrated $V_{fsst}$ passes through a sixth amplifier 350 and into a divisional circuit 355, where the calibrated $V_{fsst}$ is divided by $V_{alpha}$ 360. A result representing $(V_{fsst}-V_{IRO})/V_{alpha}$ passes through a seventh amplifier 365 and from there passes into the thermal summing circuit 330, and is summed there with the modified power usage signal to yield a summation. The summation passes into a difference circuit (or subtraction circuit) 375, which subtracts the summation from the set point temperature voltage 370 to yield a resulting signal. This signal represents the instantaneous temperature error.

The resulting signal is provided to a derivative circuit 380, which takes the derivative of the resulting circuit with respect to time and smoothes it out. The derivative signal is amplified by a sixth amplifier 390 before leaving the thermal control circuit as the temperature control signal $V_{tcs}$ 35.

The derivative circuit 380 represents the overall control section of the thermal control circuit 25. This is where the circuit's response time to instantaneous signal level changes is determined. Although characterized by the derivative circuit 380, the control circuit 25 can be described as a PI style control loop because there is a proportional and integral gain stage in the control circuit 25.

Other control circuits may use true PID control by, for example, either designing a custom system or using an off the shelf commercial servo controller. Such a system adds capabilities like continuous ramping, s-curve profiling, servo tuning for minimal overshoot and undershoot, and improved closed-loop control stability. Depending upon the particular controller used, the PID controller may need to convert the temperature signals and the power signal to some sort of thermal position signal, and feed it back into a commercial servomotor controller. Some controllers may also need to do some conversion on the back end. As these examples indicate, the control functions required can be performed by analog and/or digital circuits.

The control system of FIG. 1 maintains the DUT temperature at a specified set point within a given tolerance. The control system must therefore have some information on the DUT temperature. Some control systems, such as those that utilize direct temperature following, require repeated DUT temperature information. Other control systems, such as those that utilize power following, control deviation from a set point and do not need repeated DUT temperature information; rather, they only need to know when to begin the temperature maintenance process.

A power following control process may begin after the DUT has reached the set point temperature. This information may be determined indirectly, for example, after a soak timer has expired. It may also be determined directly, for example, by monitoring a thermal structure. Thermal structures can be used to supply initial DUT temperature information and they can also be monitored throughout the test if they are properly calibrated. Thermal structures may be monitored to determine the initial DUT temperature before initiating a power following temperature control method.

Preferably, the characterization and validation process is performed for the power following temperature control of a particular type of DUT. This process utilizes die temperature information. If a statistically relevant sample set is taken with true die temperature information during the calibration process, then no temperature sensing device in the die is necessary during high volume manufacturing and testing.

Test System With Active Power Monitoring Using Externally Located Current Sensors The information which the above-described power following system utilizes is information on the power draw of a DUT. Specifically, in the system of FIG. 1, this information is the scaled voltage image of current and voltage signals that are supplied by the power supply(s) 15. As mentioned at the outset, those signals may not be readily available with certain test units. Embodiments of the present invention are now described by which such monitor signals can be obtained in such a case.

Figure 4:
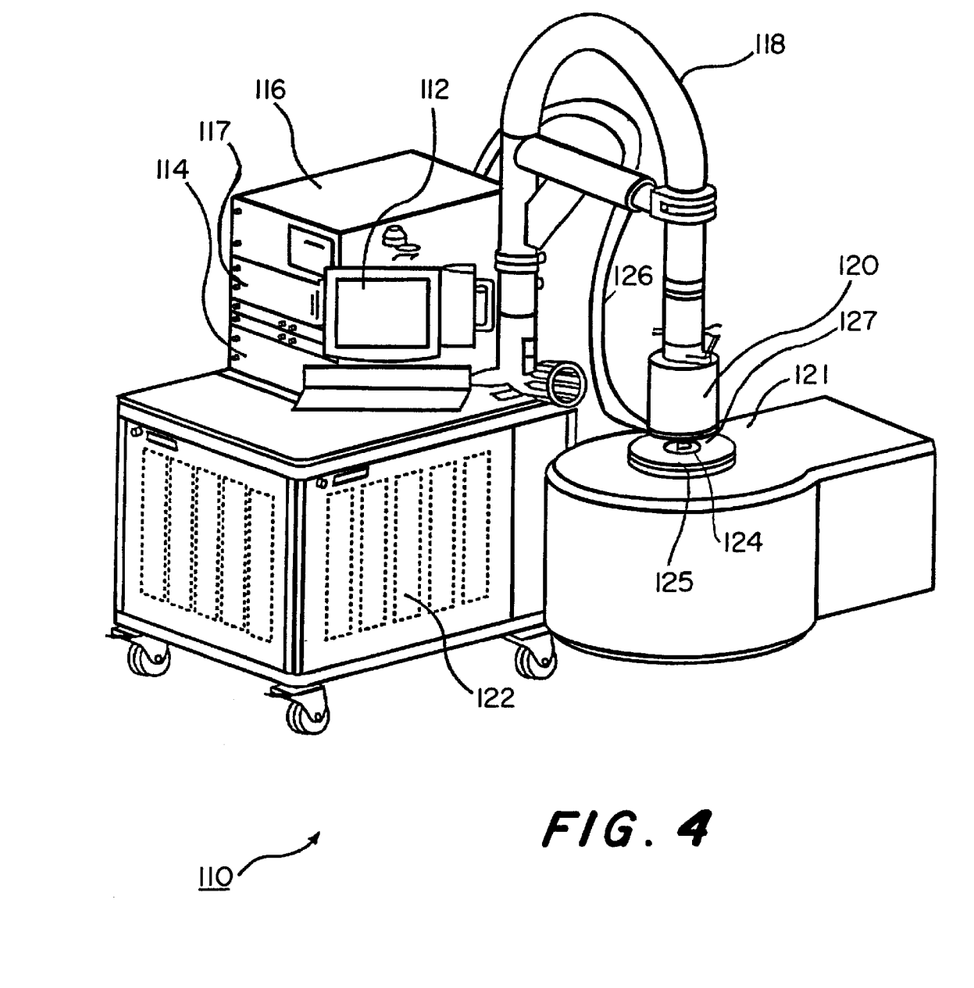
FIG. 4 is a perspective view of a thermal control test system according to an embodiment of the present invention.

FIG. 4 is a perspective view of a system 110 according to an embodiment of the present invention. In this system, a DUT 124 is connected to a test unit 121. For example, the DUT 124 is located in a test socket 127 that is operatively connected to a load board (also commonly known as an interface board) 125 of a test unit 121. Specifically, insertion of the test socket 127 into the load board 125 establishes electrical connections between the test unit 121 and the DUT 124. Through these connections, the test unit 121 provides a core supply voltage to the DUT 124. In a typical application, the test unit 121 also sends and receives signals to the I/O ports of the DUT, by which the test unit may perform various tests on the DUT. In accordance with the technique described above, the power of the DUT 124 is monitored based on power consumption calculated from the core voltage supply.

As described in greater detail below, one or more current sensors are provided on the load board 125 in-line with the core voltage supplied by the test unit 121. It will be appreciated, however, that the current sensors are not necessarily located on the load board 125, but instead could be placed in alternate locations. For example, the sensors could be disposed on an intermediate platform located between the output of the power supply and the input of the load board. Using the current sensor(s), a voltage signal representative of the current drawn by the DUT is obtained.

In this example, the current signal, as well as the DUT ground and primary voltage signals, are provided to a control board 117 through an interface cable 126. The control board 117 in this particular embodiment is provided at a thermal control chassis 116. The thermal control chassis 116 includes a system controller 114. The system controller 114 comprises various control circuits, which, among other functions, controls the heat exchanger 120. The heat exchanger 120 maintains the temperature of the DUT 124 near a constant set point during testing. As illustrated in FIG. 4, operator control is provided at the operator interface panel 112, which serves as an interface to the system controller 114. Other configurations of these components will be apparent to those skilled in the art.

While it will be appreciated that the present invention may be utilized with various types of temperature control systems, in this embodiment, the temperature of the DUT 124 is maintained by a conductive heat exchanger 120 of a type generally described in U.S. Pat. No. 5,821,505, the disclosure of which is hereby incorporated by reference as if fully set forth herein. It has been found that this type of heat exchanger can react very quickly to changes in DUT temperature. Such heat exchanger 120 includes a heater and a heat sink. The heater is disposed between the DUT and the heat sink. The system controller 114 selectively activates the heater to maintain the temperature of the DUT above a constant temperature above the temperature of the heat sink. The liquid cooling and recirculation system 122 supplies a liquid to the heat exchanger 120, specifically to the heat sink, through the boom arm 118. The boom arm 118 also carries the control signals from the system controller 114 to the heater.

Figure 5:
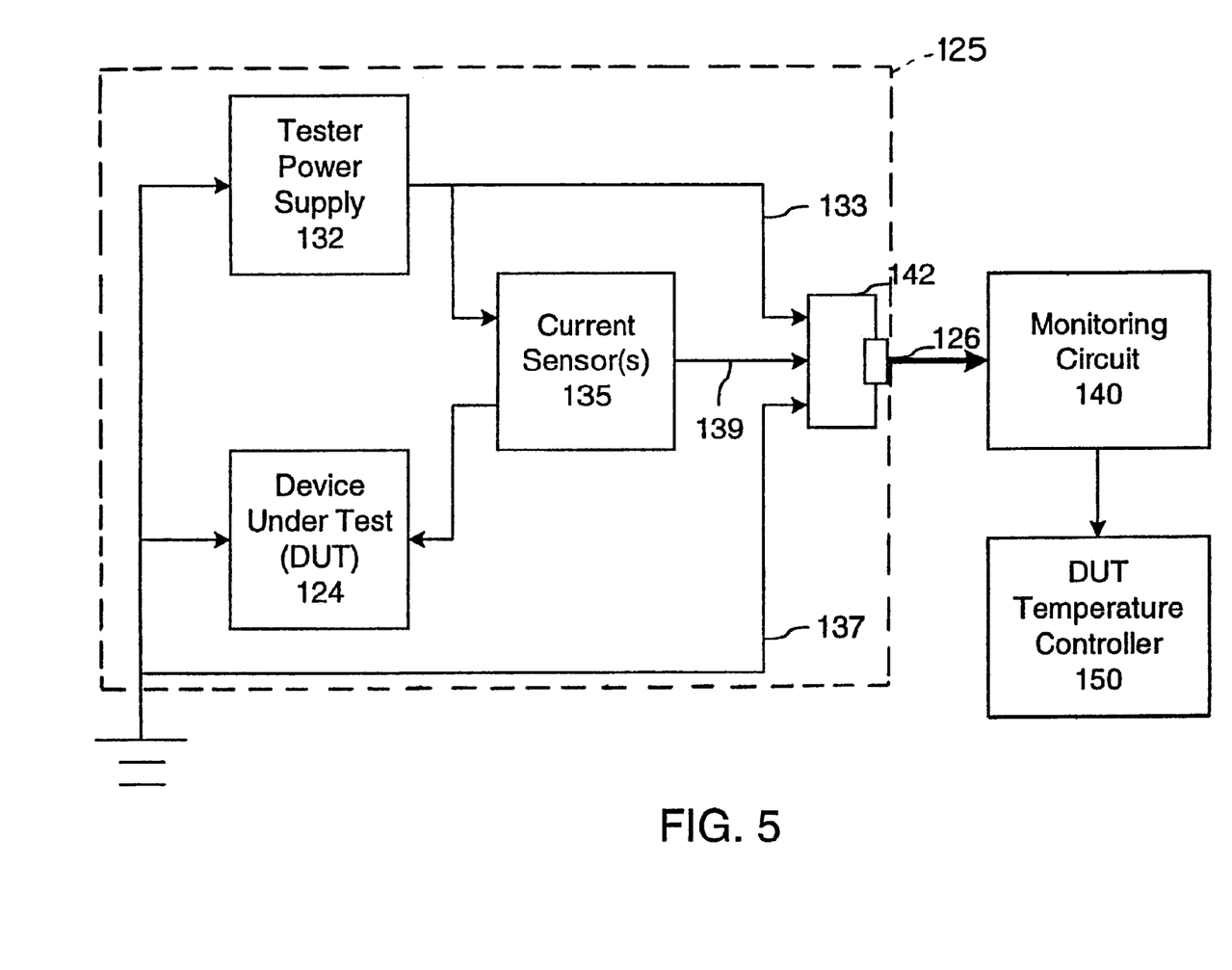
FIG. 5 is a block diagram of an active power monitoring circuit in accordance with the invention.

FIG. 5 is a simplified block diagram of the active power monitoring circuit according to the invention. As illustrated, a power supply 132, for example, from a semiconductor test unit, provides a core voltage supply 133 to the DUT 124. A current sensor 135 is inserted in-line between the power supply 132 and the DUT 124. The current sensor 135 detects the current to the DUT 124 with virtually zero-insertion loss of DUT core voltage. The current sensor(s) 135 provides a voltage signal(s) 139 that is (are) indicative of the current to the DUT 124. As represented in dashed lines, in this example of the invention, the current sensor(s) 135 is disposed on a load board 125 of a semiconductor test unit. In this example, output signals from the current sensor(s) and other elements of the load board 125 are provided from a surface mounted connector on the load board 125 to a monitoring circuit 140 via an interface cable 126.

In accordance with an aspect of the invention, zero insertion loss with respect to the current sensor(s) is achieved by use of magneto-resistive current sensors that provide superior electrical isolation over traditional passive current detection. The portion of the current sensor that actually carries the current consists of a buss bar attached to the sensor. The buss bar offers zero-insertion loss of the DUT core voltage. No voltage is dropped through the current detection circuitry.

The current sensors of the preferred embodiment employ permalloys (such as nickel-iron alloys) and other ferromagnetic materials to take advantage of a magneto-resistive (MR) effect. MR devices employed with this aspect of the invention are highly sensitive to magnetic fields, significantly more so than Hall effect sensors. For example, MR current sensors from F.W. Bell, Part Nos. NT-25 or NT-50, may advantageously be utilized which provide a sensitivity range of up to 25 amperes or 50 amperes, respectively. Such sensors use four highly symmetrical MR devices arranged in a Wheatstone bridge configuration allowing improved sensitivity and offset variability. This allows the current sensor to be constructed without a magnetic core. A Barberpole biasing technique extends the linear region of the MR devices.

As illustrated in FIG. 5, the interface cable 126 provides the current signal 139, the core voltage signal 133 as well as the DUT common reference voltage, to a monitoring circuit 140. The monitoring circuit 140 receives the DUT core voltage and passes it through an isolation amplifier. The output of the amplifier is multiplied by the proportional current monitor voltage from the current sensor(s) 135 to obtain a power signal. A DUT temperature controller 150 uses the power signal to control the temperature of the DUT 124, for example, by controlling a heat exchanger as described above.

In accordance with another feature of the invention, the current sensors 135 are selected based on the projected maximum current draw by the DUT 125. For example, a single F.W. Bell NT-25 sensor provides a maximum sensing range of 25 ampere. A single F.W. Bell NT-50 sensor provides a maximum 50 ampere range. As discussed below, larger ranges may be obtained by placing more than one sensor of the same type (for example, a 50 A sensor) in parallel, dividing the current path evenly through each sensor and then summing the detected current signals from each sensor.

Figure 6A:
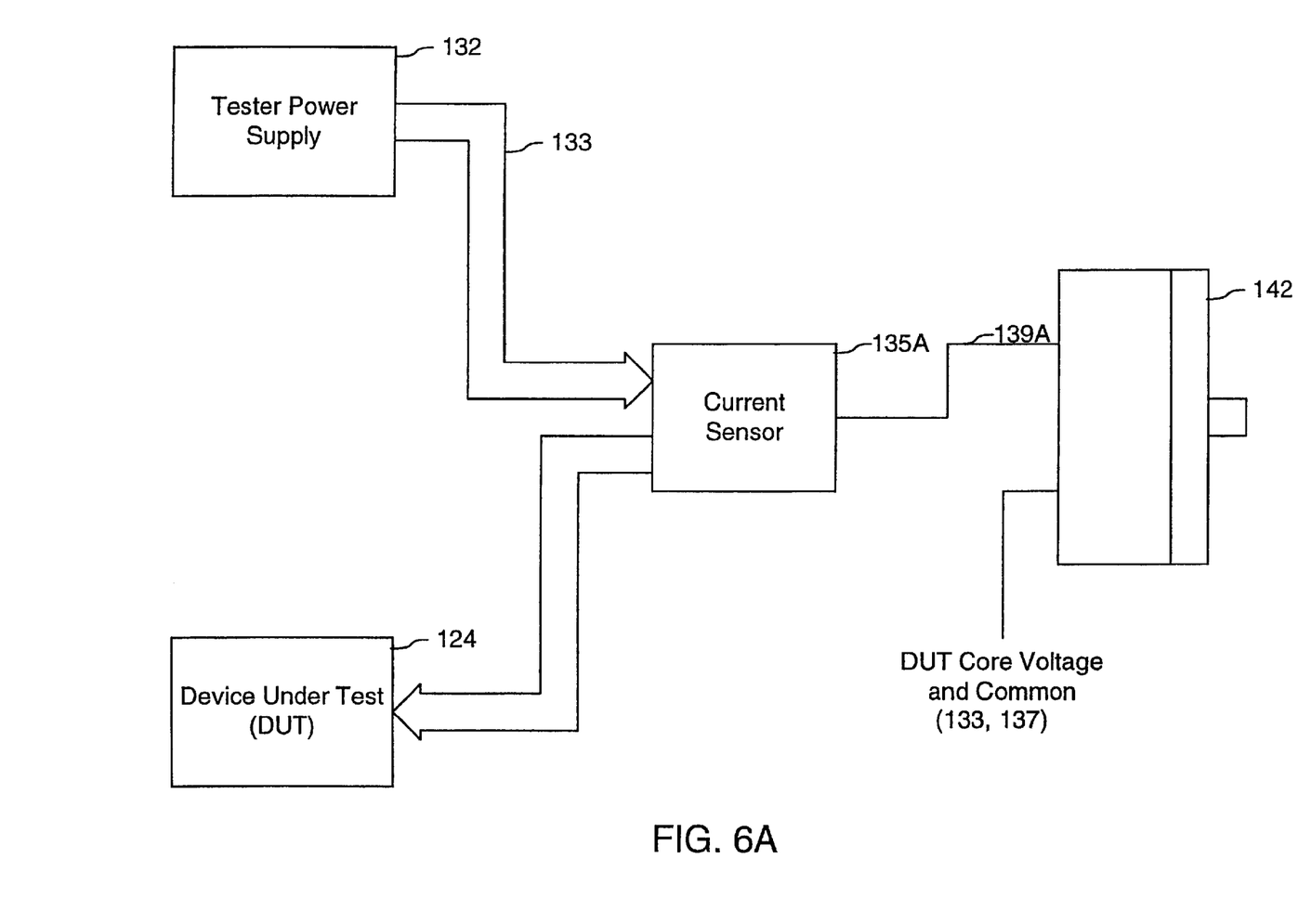
FIG. 6A is block diagram of a single current sensor arrangement according to a first example of the sensor circuit of the invention.

FIG. 6A illustrates a first example in which a single current sensor 135A, such as a 25 A or 50 A sensor, is disposed on a load board with the DUT 124. The current sensor 135A is disposed in series with the core voltage supply 132 to the DUT 124. The current sensor 135A provides an output voltage 139A proportional to the detected current to the DUT 124 through the core voltage supply line. That output 139A may be provided to a surface mounted connector 149 on the load board. The connector also receives the DUT core voltage 133 and the DUT common reference voltage 137.

Figure 6B:
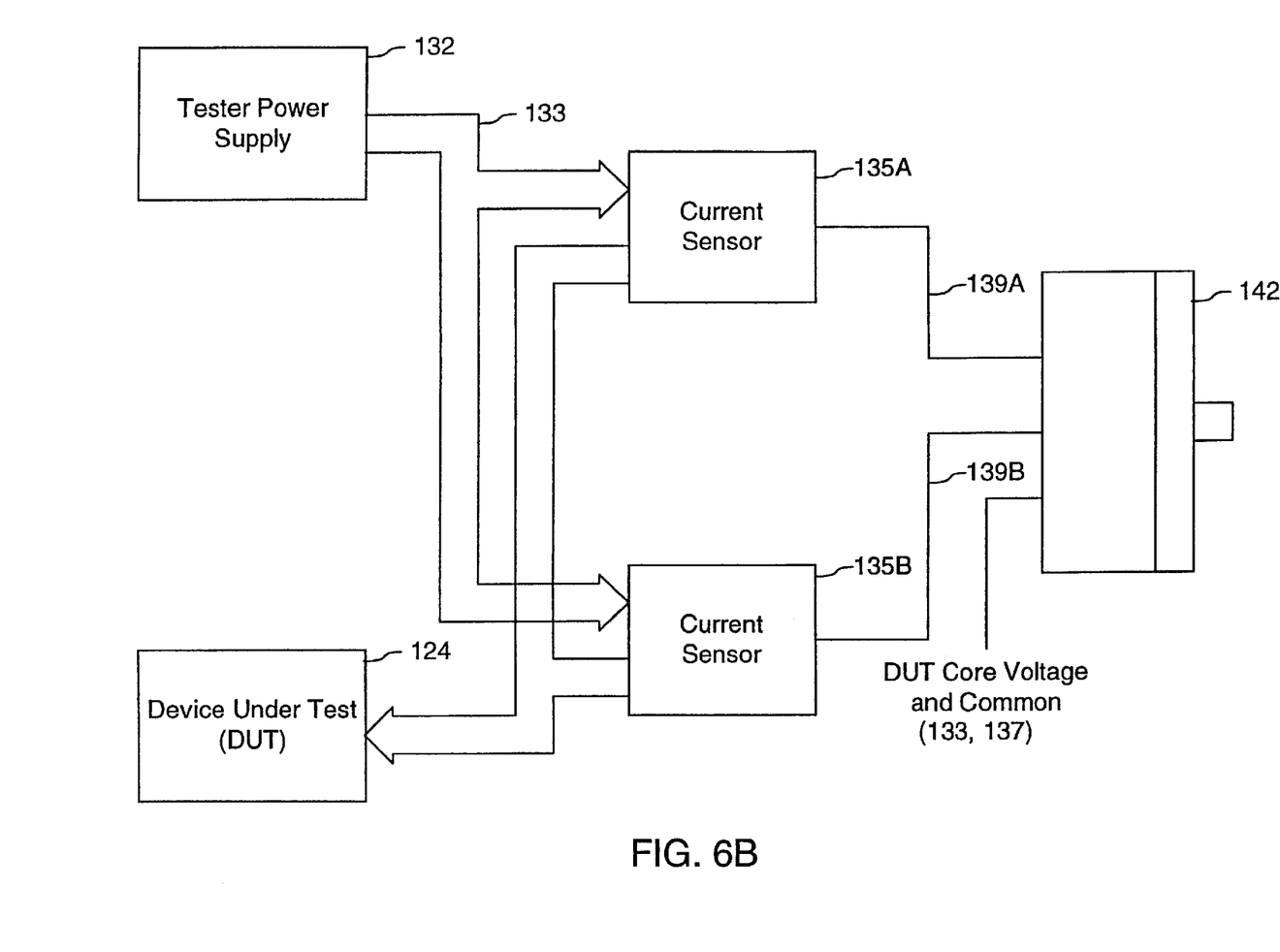
FIG. 6B is a block diagram of a dual current sensor arrangement according to a second example of the sensor circuit of the invention.

FIG. 6B is a block diagram of a second example, in which two current sensors 135A, 135B (for example, two 50 A sensors) are disposed in parallel on the load board, each between the tester core voltage power supply 132 and the DUT 124. Current to the DUT 124 is evenly divided between the two sensors 135A, 135B. Voltage signals 139A, 139B representative of the current detected by the sensors 135A, 135B are provided separately to a surface mounted connector 142. In this way, the outputs of the sensors may then be summed to obtain a single signal representative of total current. Thus, the maximum range of the sensors 135A, 135B is double that of a single sensor. For example, two 50 A sensors provide a range up to 100 A.

Figure 6C:
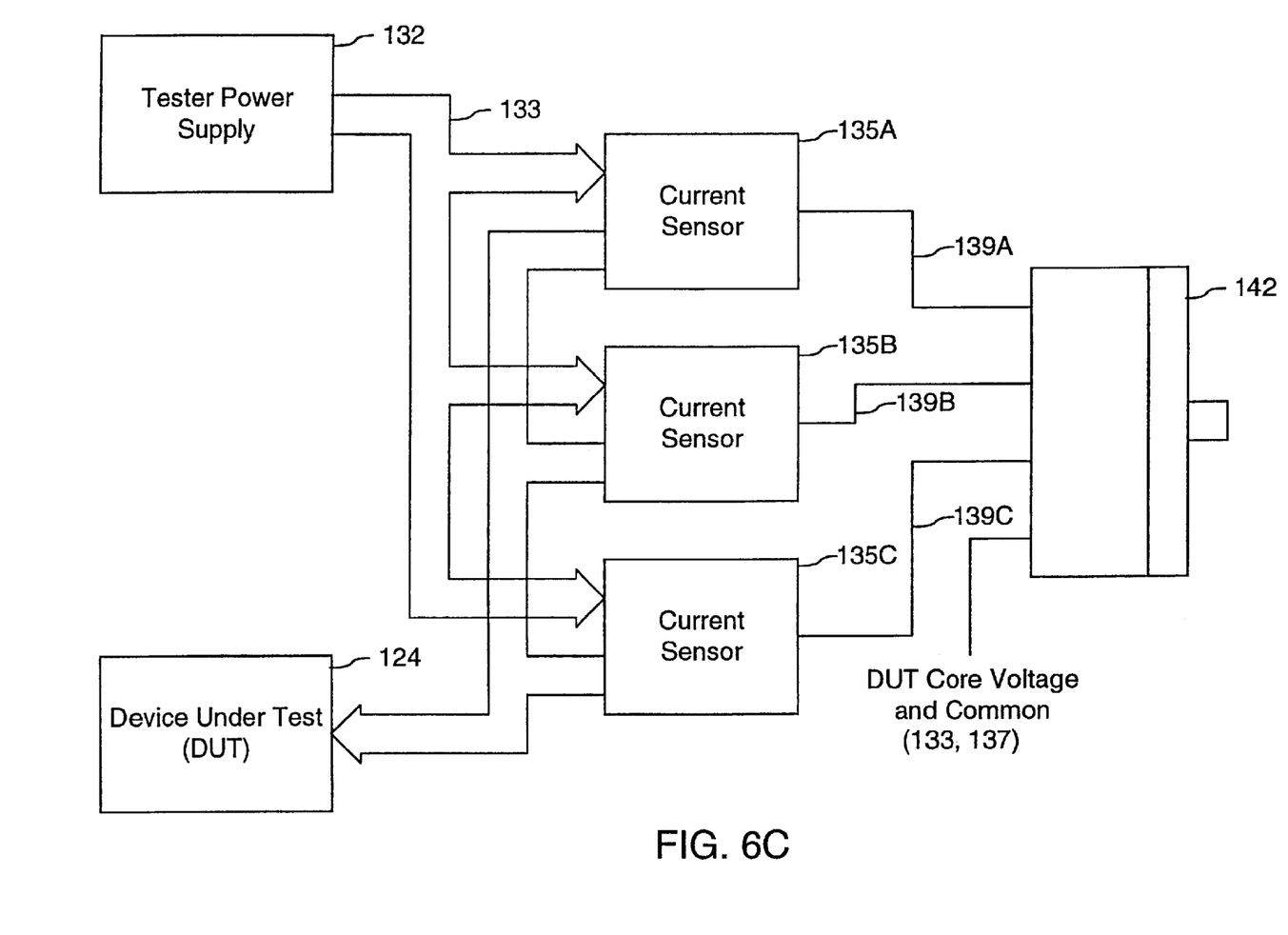
FIG. 6C is a block diagram of a three current sensor arrangement according to a third example of the sensor circuit of the invention.

FIG. 6C is a block diagram of a third example, in which three current sensors 135A, 135B, 135C (for example, three 50 A sensors) are disposed in parallel on the load board, each between the tester core voltage power supply 132 and the DUT 124. Current to the DUT 124 is evenly divided among the three sensors 135A, 135B, 135C. Voltage signals 139A, 139B, 139C representative of the current detected by the sensors 135A, 135B, 135C are provided separately to a surface mounted connector. In this way, the outputs of the sensors may be summed as discussed with FIG. 6B. As a result, the maximum range of the sensors 135A, 135B, 135C is three times that of a single sensor. For example, two 50 A sensors provide a range up to 150 A.

FIGS. 6A to 6C illustrate various examples by which different ranges of current may be detected in accordance with the invention. It will be appreciated, however, that current sensors other than those specifically identified herein may be used in conjunction with the invention. For example, other types of sensors which provide zero insertion provide different ranges of current that may be detected. Further, while in the examples of FIGS. 6A to 6C the current sensors are located on the load board of a test unit, current sensors may be disposed in alternative location to better conform to the configuration of various test unit devices. One such alternative embodiment is now described.

Figure 7:
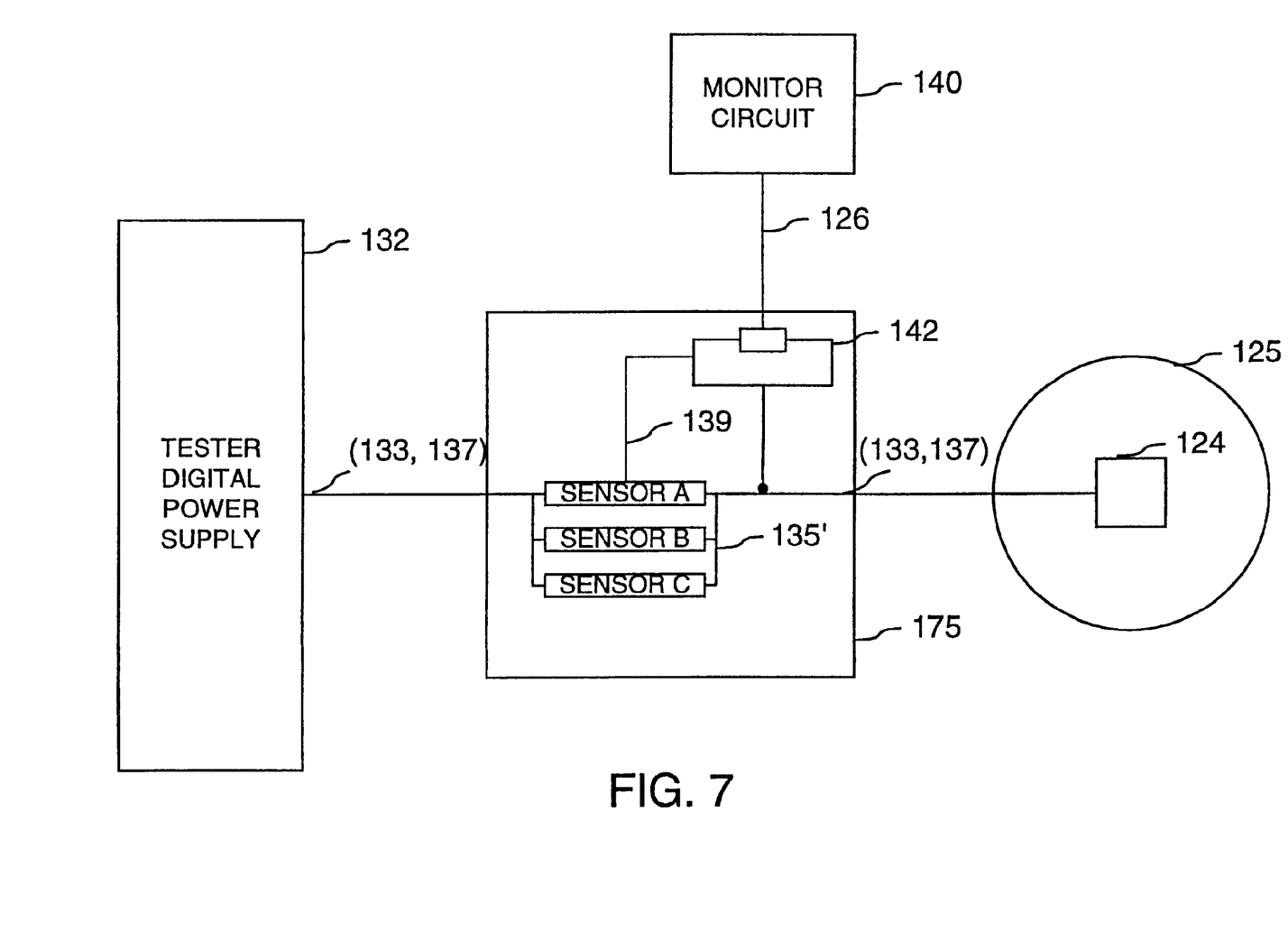
FIG. 7 is a block diagram illustrating an alternative embodiment in which current sensors are provided on a separate expansion board between the test unit power supply and the device under test.

In FIG. 7, the current sensors 135' are disposed on a separate expansion board 175. The sensors are electrically connected between a test unit digital power supply 132 and a test unit load board 125 on which a DUT is located in a test socket. This electrical connection may be established, for example, by cable that supplies the core voltage supply and common voltage (133, 137) to the DUT from the test unit power supply. As illustrated, the core voltage and common reference voltage as well as the output(s) 139 of the sensors 135' are provided to a surface mounted connection 142. These signals are provided from the surface mounted connector 142 to a monitor circuit 140 via interface cable 126. Although, three sensors A, B, C are illustrated in this example, it would be understood that one or more sensors may be utilized in the manner discussed above.

Figure 8:
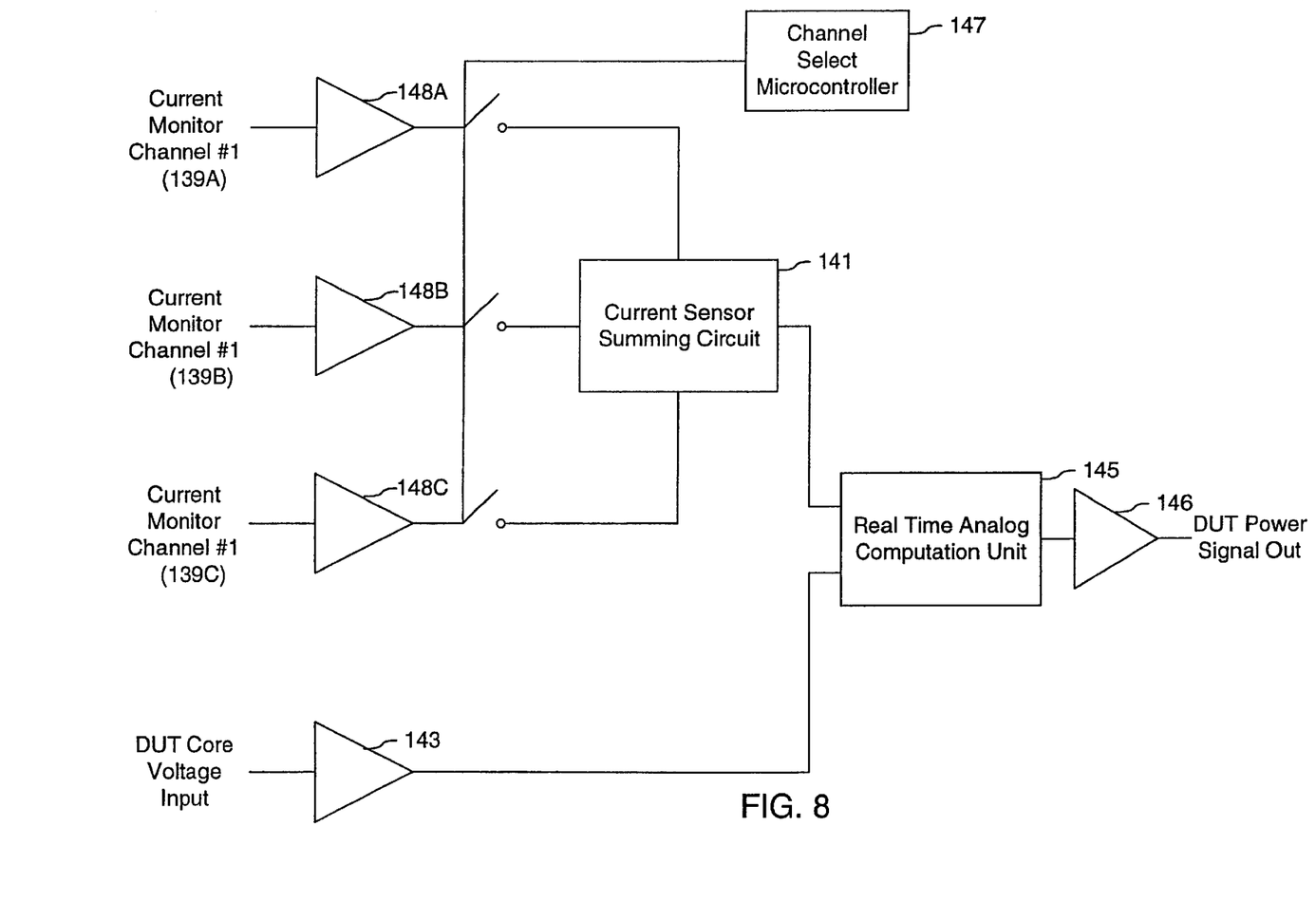
FIG. 8 is a block diagram of a monitoring circuit in accordance with an embodiment of the invention.

FIG. 8 is a more detailed block diagram of the monitoring circuit 140. A shown, the circuit of this embodiment receives the signals 139A, 139B, 139C from up to three separate current sensors via amplifies 148A, 148B, 148C. Multiple current signals are summed by summing circuit 141 to determine the total current supplied to the DUT. While three channels are illustrated, it will be appreciate that additional sensor outputs may be received and processed similarly.

The monitoring circuit 140 also includes an isolation amplifier 143 that receives as input the DUT core voltage signal 133. Such amplifier may comprise, for example, an electro-optical amplifier. The real time analog computation unit 145 multiplies the output of the isolation amplifier 143 and the summing circuit 141 to obtain a DUT power signal. The output signal may be amplified by amplifier 146, as shown.

In this example, the monitoring circuit 140 is provided on a separate printed circuit board connected directly to either the current sensor(s) mounted on the load board or to an expansion platform between the tester power suppler and the load board. The monitoring circuit board includes a microcontroller 147 that determines the number of current sensors used. This is accomplished using techniques known in the art. For example, a three bit code maybe hardwired onto the load board or expansion platform, which code corresponds to the number of current sensors. The microcontroller 147 uses this code to select automatically which of the plural input channels to enable as part of the summing process.

The power signal may be acquired using techniques known in the art. For example, a data acquisition card may utilize analog and/or digital circuitry. Preferably the data acquisition card contains an analog-to-digital converter with multiple channels. An off-the-shelf board, such as model number PCI-6031E made by National Instruments maybe used, for the data acquisition card. The data acquisition card may also perform a variety of control functions, such as setting the sampling rate and other parameters. In a preferred embodiment, however, the data acquisition card sends the data to another controller. It will be recognized that a general purpose personal computer ("PC") may serve as the controller. Data received by the PC can be stored on a digital storage medium such as, for example, a hard disk, floppy disk, optical disk, ZIP disk, or Bernoulli drive. The data can also be transmitted, displayed on a display device such as a computer screen, or processed. Other embodiments may also encompass additional processors or equipment, including analog equipment, which utilize the data.

A PC based controller may include a Pentium processor and use the Windows NT operating system. Various communications cards and protocols can be used between the PC, and the data acquisition card, including without limitation, a universal asynchronous receiver transmitter ("UART"), a universal receiver transmitter ("URT"), and the RS-232 standard. In a preferred embodiment, the data acquisition card also acquires various other information, including without limitation, DUT temperature information, heat exchanger power information, coolant flow rates, and fluid inlet and outlet temperatures.

Modifications and Benefits

As one skilled in the relevant art will readily appreciate, in light of the present and incorporated disclosures, the functions of the overall system can be implemented with a variety of techniques. Electrical circuits are disclosed herein for the monitoring circuit and the thermal control circuit, but other implementations are possible for these functions, as well as for others such as producing the signals representing the current, voltage, temperature, and power.

The functionality disclosed herein can be implemented by hardware, software, and/or a combination of both. Software implementations can be written in any suitable language, including without limitation high-level programming languages such as C++, mid-level and low-level languages, assembly languages, and application-specific or device-specific languages. Such software can run on a general purpose computer such as a 486 or a Pentium, an application specific piece of hardware, or other suitable device.

In addition to using discrete hardware components in a logic circuit, the required logic may also be performed by an application specific integrated circuit ("ASIC") or other device. The technique may use analog circuitry, digital circuitry, or a combination of both. The system will also include various hardware components which are well known in the art, such as connectors, cables, and the like. Moreover, at least part of this functionality may be embodied in computer readable media (also referred to as computer program products), such as magnetic, magnetic-optical, and optical media, used in programming an information-processing apparatus to perform in accordance with the invention. This functionality also may be embodied in computer readable media, or computer program products, such as a transmitted waveform to be used in transmitting the information or functionality.

Further, the present disclosure should make it clear to one skilled in the art that the present invention can be applied to a variety of different fields, applications, industries, and technologies. The present invention can be used, without limitation, with any powered system in which temperature must either be monitored or controlled. This includes without limitation many different processes and applications involved in semiconductor fabrication, testing, and operation.

Additionally, the preferred embodiment calculates, or monitors, the power which is supplied to a DUT from a power supply. This power is typically provided to a power plane or grid of some sort on the DUT, through one or more power connections in the DUT. This is to be differentiated from the power inherent in any signal. Clearly, any signal connection on a device is designed to receive the specified power of that signal, for example a clock signal. However, the power which the preferred embodiment monitors is the power provided from a power supply to the power connections, and not the power inherent in a signal which might be supplied to a signal connection. A power supply, as used above, refers to a standard industry device which can supply electrical power at a specified voltage for operating a device. It should be clear, however, that the techniques of the present invention could be applied to any signal, including without limitation a power signal, a clock signal, and a data signal. These techniques could also be applied to non-standard power supplies.

The benefits of the present invention include providing an apparatus and method of temperature control for electronic devices which can determine the power supplied to a device under test or in operation using a technique compatible with different types of power supply devices based in conjunction with the power following technique described above, the invention provides an apparatus and method of temperature control for electronic devices which can conveniently be used for high volume chip manufacturing. A further benefit of the present invention is that it provides an apparatus and method of temperature control for electronic devices which is reliable.

Another benefit of the present invention is that it provides an apparatus and method of temperature control for electronic device which does not require significant surface area of the electronic device for sensing the device temperature, although the system does require surface area for conduction. Still another benefit of the present invention is that it eliminates the need for temperature sensing devices to be integrated into the chip or to be temporarily connected to the chip.

Yet another benefit is that the present invention also eliminates the need to collect, maintain, and apply the use of chip power profiles, as well as eliminating the need for the capability in the automated test equipment, temperature forcing system and testing software to collect and apply chip power profiles.

The principles, preferred embodiments, and modes of operation of the present invention have been described in the foregoing specification. The invention is not to be construed as limited to the particular forms disclosed, because these are regarded as illustrative rather than restrictive. Moreover, variations and changes may be made by those of ordinary skill in the art without departing from the spirit and scope of the invention.

What is claimed is:

1. A device for active monitoring of power of an electronic, semiconductor device under test (DUT) comprising:
   at least one magneto-resistive current sensor provided external to, and between the DUT and a power source, the current sensor providing a detection signal proportional to the current drawn by the DUT from the power source; and
   a monitoring circuit that receives as input the detection signal from the magneto-resistive current sensor and a signal representative of voltage supplied to the DUT from the power source, the monitoring circuit multiplying the detection signal and the signal representative of the voltage supplied to DUT from the power source to obtain a signal representative of the power of the DUT.

2. The device according to claim 1, wherein the monitoring circuit includes an isolation amplifier that provides an isolated signal based on the signal representative of the voltage supplied to the DUT from the power source, which isolated signal is multiplied by a signal corresponding to total current drawn by the DUT as detected by the at least one current sensor.

3. The device according to claim 1, wherein the at least one current sensor is located on a board of a semiconductor test unit on which the DUT is connected for testing.

4. The device according to claim 3, wherein the monitoring circuit is connected to the board of the semiconductor test unit by an interface cable, the interface cable transmitting signals from the at least one current sensor.

5. The device according to claim 1, wherein the at least one current sensor is located on a board that is separate from a board of a semiconductor test unit on which the DUT is socketed for testing.

6. The device according to claim 5, wherein the monitoring circuit is connected to the at least one current sensor by an interface cable, the interface cable signals from the at least one current sensor.

7. The device according to claim 1, wherein the at least one current sensor is comprised of a plurality of current sensors arranged in parallel to thereby divide the current supplied from the power supply to the DUT, wherein each current sensor outputs a corresponding detection signal proportional to detected current.

8. The device according to claim 7, wherein the monitoring circuit sums each output from the plurality of current sensors to obtain a signal corresponding to the total current drawn by the DUT.

9. The device according to claim 1, wherein the signal representative of the power of the DUT is provided to a thermal control circuit that controls the temperature of the DUT.

10. The device according to claim 9, wherein the thermal control circuit controls a heat exchanger that selectively heats or cools the DUT in response to detected power drawn by the DUT to maintain the DUT near a constant set point.

11. A method of detecting the power of an electrical, semiconductor device under test (DUT), comprising:
    detecting current drawn by the DUT from a power source with at least one magneto-resistive current sensor provided external to, and between the DUT and the power source, the current sensor providing a detection signal proportional to the current drawn by the DUT from the power source; and
    calculating the instantaneous power of the DUT based on the detection signal from the magneto-resistive current sensor and a signal representative of voltage supplied to the DUT from the power source.

12. The method according to claim 11, wherein the monitoring circuit includes an isolation amplifier that provides an isolated signal based on the signal representative of the voltage supplied to the DUT from the power source, which isolated signal is multiplied by a signal corresponding to total current drawn by the DUT as detected by the at least one current sensor.

13. The method according to claim 11, wherein at least one current sensor is located on a board of a semiconductor test unit on which the DUT is connected for testing.

14. The method according to claim 13, wherein the monitoring circuit is connected to the board of the semiconductor test unit by an interface cable, the interface cable transmitting signals from the at least one current sensor.

15. The method according to claim 11, wherein the at least one current sensor is located on a board that is separate from a board of a semiconductor test unit on which the DUT is connected for testing.

16. The method according to claim 15, wherein the monitoring circuit is connected to the at least one current sensor by an interface cable, the interface cable providing signals from the at least one current sensor.

17. The method according to claim 11, wherein the at least one current sensor is comprised of a plurality of current sensors arranged in parallel to thereby divide the current supplied from the power supply to the DUT, wherein each current sensor outputs a corresponding detection signal proportional to detected current.

18. The method according to claim 17, wherein the monitoring circuit sums each output from the plurality of current sensors to obtain a signal corresponding to the total current drawn by the DUT.

19. The method according to claim 11, further comprising the step of providing the signal representative of the power of the DUT to a thermal control circuit that controls the temperature of the DUT.

20. The method according to claim 19, wherein the thermal control circuit controls a heat exchanger that selectively heats or cools the DUT in response to detected power drawn by the DUT to maintain the electronic device near a constant set point.

21. A system for controlling the temperature of an electronic device comprising:
    an active power measuring circuit comprised of at least one magneto-resistive current sensor provided external to, and between the electronic device and a power source, the current sensor providing a detection signal proportional to the current drawn by the electronic device from the power source, which detection signal is multiplied by a signal representative of voltage supplied to the electronic device from the power source to obtain a signal representative of the power of the electronic device;

a heat exchanger operatively coupled to regulate the temperature of the electronic device;

a control circuit that operates the heat exchanger to adjust the temperature of the electronic device based on the signal representative of the power of the electronic device.

22. The system according to claim 21, wherein the electronic device is a semiconductor device under test.

23. The system according to claim 21, wherein the at least one current sensor is located on a board that is separate from a board of a semiconductor test unit on which the electronic device is connected for testing.

24. The system according to claim 21, wherein the control circuit controls the heat exchanger to maintain the device near a constant set point.

25. The system according to claim 21, wherein the at least one current sensor is located on a board of a semiconductor test unit on which the electronic device connected for testing.

26. The system according to claim 25, wherein a monitoring circuit multiplies the signal representative of voltage supplied to the electronic device from the power source to obtain the signal representative of the power of the electronic device.

27. The system according to claim 26, wherein the monitoring circuit is connected to the at least one current sensor by an interface cable which provides signals from the at least one current sensor.

28. The system according to claim 26, wherein the monitoring circuit includes an isolation amplifier that provides an isolated signal based on the signal representative of the voltage supplied to the electronic device from the power source, which isolated signal is multiplied by a signal corresponding to total current drawn by the electronic device as detected by the at least one current sensor.

29. The system according to claim 21, wherein the at least one current sensor is comprised of a plurality of current sensors arranged in parallel to thereby divide the current supplied from the power supply to the electronic device, wherein each current sensor outputs a corresponding detection signal proportional to detected current.

30. The system according to claim 29, wherein outputs from each of the plurality of current sensors are summed to obtain a signal corresponding to the total current drawn by the electronic device.

* * * * *